(12) United States Patent
Hurkx et al.

(10) Patent No.: US 9,391,187 B2
(45) Date of Patent: Jul. 12, 2016

(54) SEMICONDUCTOR HETEROJUNCTION DEVICE

(71) Applicant: NXP B.V., Eindhoven (NL)

(72) Inventors: Godefridus Adrianus Maria Hurkx, Eindhoven (NL); Jeroen Antoon Croon, Eindhoven (NL); Johannes Josephus Theodorus Marinus Donkers, Eindhoven (NL); Stephan Bastiaan Simon Heil, Eindhoven (NL); Jan Sonsky, Louvain (BE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/723,247

(22) Filed: May 27, 2015

(65) Prior Publication Data

US 2015/0357456 A1    Dec. 10, 2015

(30) Foreign Application Priority Data

Jun. 5, 2014    (EP) .................................... 14171421

(51) Int. Cl.
*H01L 29/20*    (2006.01)
*H01L 29/36*    (2006.01)
(Continued)

(52) U.S. Cl.
CPC .......... *H01L 29/7787* (2013.01); *H01L 29/205* (2013.01); *H01L 29/32* (2013.01); *H01L 29/36* (2013.01); *H01L 29/41766* (2013.01); *H01L 29/66143* (2013.01); *H01L 29/7786* (2013.01); *H01L 29/872* (2013.01); *H01L 29/0649* (2013.01); *H01L 29/0843* (2013.01); *H01L 29/0847* (2013.01); *H01L 29/2003* (2013.01); *H01L 29/207* (2013.01)

(58) Field of Classification Search
USPC ........................................................ 257/76
See application file for complete search history.

(56) References Cited

U.S. PATENT DOCUMENTS

| 2005/0145851 A1 | 7/2005 | Johnson et al. |
| 2013/0126893 A1 | 5/2013 | Tanaka |

FOREIGN PATENT DOCUMENTS

| EP | 2 339 635 A2 | 6/2011 |
| JP | 58-51575 | 3/1983 |
| WO | 2014/043187 A1 | 3/2014 |

OTHER PUBLICATIONS

Uren, M.J. et al. "Intentionally Carbon Doped AlGaN/GaN HEMTs: the Necessity for Vertical Leakage Paths" Electron Device Letters, IEEE, vol. 35, No. 3, pp. 327-329 (Mar. 2014).

(Continued)

*Primary Examiner* — Asok K Sarkar
*Assistant Examiner* — Dmitriy Yemelyanov

(57) ABSTRACT

In an example embodiment, a heterojunction device comprises a substrate, a multilayer structure disposed on the substrate. The multilayer structure has a first layer having a first semiconductor disposed on top of the substrate; a second layer has a second semiconductor is disposed on top of the first layer defining an interface between them. The second semiconductor differs from the first semiconductor such that a 2D Electron Gas forms adjacent to the interface. A first terminal couples to a first area of the interface between the first and second layers and a second terminal couples to a second area of the interface between the first and second layers; an electrically conducting channel comprises a metal or a region of the first layer with a higher defect density than another region of the first layer. The channel connects the second terminal and a region of the first layer such that electric charge can flow between them.

17 Claims, 6 Drawing Sheets

(51) Int. Cl.
*H01L 29/778* (2006.01)
*H01L 29/205* (2006.01)
*H01L 29/32* (2006.01)
*H01L 29/417* (2006.01)
*H01L 29/66* (2006.01)
*H01L 29/872* (2006.01)
*H01L 29/06* (2006.01)
*H01L 29/08* (2006.01)
*H01L 29/207* (2006.01)

(56) References Cited

OTHER PUBLICATIONS

Werquin, M. et al. "Performance of AlGaN/GaN HEMTs in Planar Technology", 12$^{th}$ GAAS Symp., pp. 303-306 (2004).

Extended European Search Report for EP Patent Appln. No. 14171421.2 (Jan. 7, 2015.

SEMICONDUCTOR HETEROJUNCTION DEVICE

CROSS-REFERENCE TO RELATED APPLICATIONS

This application claims the priority under 35 U.S.C. §119 of European patent application no. 14171421.2, filed on Jun. 5, 2014, the contents of which are incorporated by reference herein.

This disclosure relates to semiconductor heterojunction devices such as high electron mobility transistors (HEMTs) and Schottky diodes.

A first aspect of the invention provides a heterojunction semiconductor device comprising: a substrate; a multilayer structure disposed on the substrate, the multilayer structure comprising: a first layer comprising a first semiconductor disposed on top of the substrate; a second layer comprising a second semiconductor disposed on top of the first layer to define an interface between the first layer and the second layer, wherein the second semiconductor is different from the first semiconductor such that a Two-Dimensional Electron Gas (2DEG) forms adjacent to the interface; a first terminal electrically coupled to a first area of the interface between the first layer and second layer; a second terminal electrically coupled to a second area of the interface between the first layer and second layer, and an electrically conducting channel, wherein the electrically conducting channel connects the second terminal and a region of the first layer such that electric charge can flow between the second terminal and the first layer (e.g. so that electric charge can flow into the second terminal from the first layer).

The electrically conducting channel may comprise a metal. The metal may be an extension of the second terminal up to, and optionally into, the first layer.

The electrically conducting channel may comprise a region of the first layer with a higher defect density than another region of the first layer. For example, the higher-defect-density region of the first layer may comprise a region underneath the second terminal and have a higher defect density than the rest of the first layer. The higher-defect-density region of the first layer may comprise a region underneath the second terminal and have a higher defect density than a region of the first layer underneath the first terminal. The higher-defect-density region of the first layer may comprise a region underneath the second terminal and have a higher defect density than a region between the first and second terminals. Defects introduce traps (i.e. states in the bandgap of the material) via which charge carriers can propagate (so-called hopping) under influence of a strong electric field.

The electrically conducting channel may have a higher conductivity than the first layer.

The electrically conducting channel may have the same conductivity as, or a different conductivity than, the second terminal.

The conducting channel may be located below the second terminal within the area of the second terminal. That is, when viewed from above the conducting channel would be within the footprint of the second terminal.

Throughout the present specification, the descriptors relating to relative orientation and position, such as "back", "front", "top", "bottom" and "side" as well as any adjective and adverb derivatives thereof, are used in the sense of the orientation of the semiconductor device as presented in the drawings. However, such descriptors are not intended to be in any way limiting to an intended use of the described or claimed invention.

The conducting channel may be located below the second terminal and extend partially towards the first terminal.

The electrically conducting channel may comprise a region of the first layer comprising defects. The defects may have been induced by implantation of one or more non-doping elements. In this context, a non-dopant element is an element which does not result in p-type or n-type regions when introduced into the semiconductor lattice. The non-dopant elements may comprise one or more of argon and nitrogen. The implantation doses may be in the range of 1e11 to 1e12 per $cm^2$. An argon dose of around 1e13 per $cm^2$ may be used.

The implantation dose may be element dependent. For example, a heavier element may require a lower dose to damage the crystal structure. The implanted area may extend, for example, from the second terminal towards the first terminal or in a patterned fashion (e.g. in stripes or dots).

When implantation is used within the footprint of the second terminal (e.g. so that the implanted area is not between the second terminal and the first terminal) the dose of the implantation can be higher, up to the dose where it effectively removes the Two-Dimensional Electron Gas (2DEG).

The heterojunction semiconductor device may comprise a passivation layer comprising a semiconductor passivation layer disposed on top of the second layer. The passivation layer may comprise silicon nitride. The passivation layer may further comprise a dielectric layer disposed between the semiconductor passivation layer and the second layer. The passivation layer may comprise a semiconductor passivation layer in direct contact with the second layer.

The first semiconductor may be a first III-V semiconductor, and the second semiconductor may be a second III-V semiconductor.

The III-V semiconductors may comprise any metallic elements selected from group III of the periodic table together with any of the non-metallic elements selected from group V of the periodic table.

The III-V semiconductors may comprise one or more of the metallic elements aluminium, gallium and indium. The III-V semiconductors may comprise nitride semiconductors, or phosphide semiconductors, or arsenide semiconductors.

The III-V semiconductors may comprise any of the semiconductors Gallium Nitride, Aluminium Nitride, Indium Nitride, Aluminium Gallium Nitride, Aluminium Indium Nitride, Gallium Indium Nitride, Aluminium Gallium Indium Nitride, Gallium Phosphide, Aluminium Phosphide, Indium Phosphide, Aluminium Gallium Phosphide, Aluminium Indium Phosphide, Gallium Indium Phosphide, Aluminium Gallium Indium Phosphide, Gallium Arsenide, Aluminium Arsenide, Indium Arsenide, Aluminium Gallium Arsenide, Aluminium Indium Arsenide, Gallium Indium Arsenide, and Aluminium Gallium Indium Arsenide.

The first layer may be a p-type semiconductor doped with a first concentration of p-type dopants. The second layer may be an n-type semiconductor, or the second layer may be an undoped semiconductor, or the second layer may be a p-type semiconductor doped with a second concentration of p-type dopants where the second concentration is less than the first concentration.

The first layer may comprise Gallium Nitride. The first layer may be semi-insulating (e.g. having a resistivity typically higher than 1 MΩcm). The second layer may comprise Aluminium Gallium Nitride.

The electrical coupling of the first terminal to the heterojunction device may comprise a Schottky contact with the second layer and the electrical coupling of the second terminal to the heterojunction device may comprise an Ohmic contact with the second layer, such that the device is configured to comprise a Schottky diode. In this way, each of the first and second terminals is configured to be electrically coupled to an area of the interface between the first and second layers to interact with the Two-Dimensional Electron Gas.

The heterojunction semiconductor device may comprise a third terminal electrically coupled to a third area of the heterojunction device such that the first terminal is positioned between the second terminal and the third terminal. The heterojunction semiconductor device may further comprise a third terminal electrically coupled to a third area of the heterojunction device such that the first terminal is positioned between the second terminal and the third terminal. In this way, each of the first, second and third terminals is configured to be electrically coupled to an area of the interface between the first and second layers to interact with the Two-Dimensional Electron Gas.

The third terminal may comprise a source terminal; the second terminal may comprise a drain terminal; the first terminal may comprise a gate terminal; whereby the heterojunction semiconductor device is configured to comprise a High Electron Mobility Transistor (HEMT).

The heterojunction semiconductor device may comprise a dielectric layer disposed between the second layer and the semiconductor passivation layer, wherein:
  the third terminal comprises a source terminal electrically coupled to the second layer such that electric charge can flow from the third terminal to the second layer;
  the second terminal comprises a drain terminal electrically coupled the second layer such that electric charge can flow from the second layer into the second terminal;
  the first terminal comprises a gate terminal disposed on top of the dielectric layer;
  whereby the heterojunction semiconductor device is configured to comprise a Metal-Insulator-Semiconductor High Electron Mobility Transistor.

There may be provided an integrated circuit comprising any heterojunction semiconductor device disclosed herein.

The metal conducting channel may be provided in practice by first etching through to the first layer to form a recess (e.g. after dry etching the contact holes through the passivation layer, typically with a fluorine dry etch chemistry). Then the ohmic metal is deposited, contacting the region wherein the 2DEG will be formed in-use (as in conventional heterojunction devices) and the first layer (e.g. comprising p-type GaN). For GaN/AlGaN embodiments, the recess may be formed using a $BCl_3/Cl_2$-based dry etch chemistry.

Examples of the invention will now be described in detail with reference to the accompanying figures, in which:

FIG. 3c is an overhead view of the device of FIG. 3a;

FIG. 4b is a perpendicular cross-section of the device of FIG. 4a; and

Semiconductor heterojunction devices may comprise a first layer of semiconductor material disposed on a substrate and a second layer of a different semiconductor material disposed on the first layer. The interface between the two layers is the heterojunction. With the appropriate selection of the two different semiconductor materials, the difference between the two semiconductors will result in the formation of a Two-Dimensional Electron Gas (2DEG) at the interface. The 2DEG within the heterojunction device enables a high electrical current to flow through the device with low electrical resistance.

Such devices may be switched between an off state, in which the device can block a high drain-to-source voltage while having a low leakage current, and an on-state, where they carry a high current at a low voltage. Switching-off is achieved by applying a suitable voltage to a first terminal of the device such that the 2DEG disappears (or is significantly reduced). The design of these devices is such that an optimum trade-off is found between the power losses in on-state, off-state and during switching.

Suitable semiconductor materials for the first and second layers include the group III-V semiconductors, which comprise at least one metal element selected from group III of the periodic table, such as aluminium, gallium and indium, together with a non-metallic element selected from group V of the periodic table, such as nitrogen, phosphorus or arsenic. One or both of the layers may be unintentionally doped or doped to form a p-type semiconductor.

For high power and high temperature applications, devices comprising a first layer of GaN and a second layer of AlGaN can be particularly desirable. GaN/AlGaN devices are good candidates for high-efficiency power converters requiring fast switching, low conduction losses and the ability to operate at voltages up to 1 kV.

Heterojunction devices can be configured to form transistors by including a source terminal, a drain terminal, and a gate terminal disposed between the source terminal and the drain terminal. Alternatively, such devices can be configured to form a Schottky diode by including only two electrical terminals: an anode and a cathode.

A problem addressed by the present disclosure is how to design heterojunction devices with lower electrical resistances, and in particular lower dynamic-on resistances, than previously known heterojunction devices. That is, for heterojunction devices such as high-electron-mobility transistors (HEMT) and Schottky diodes it may be desirable that the on-state resistance under dynamic (e.g. switching, pulsed, RF) conditions is not significantly higher than under DC conditions.

Figure 1A:
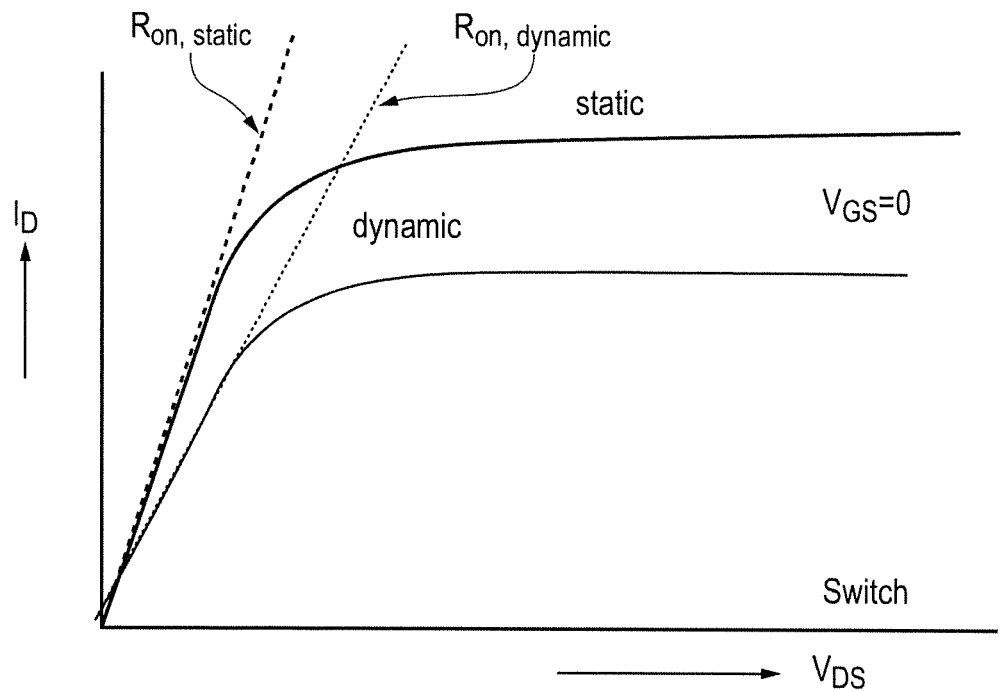
FIG. 1a is a graph showing how the voltage varies with current for a heterojunction transistor device in static and dynamic cases.
Figure 1B:
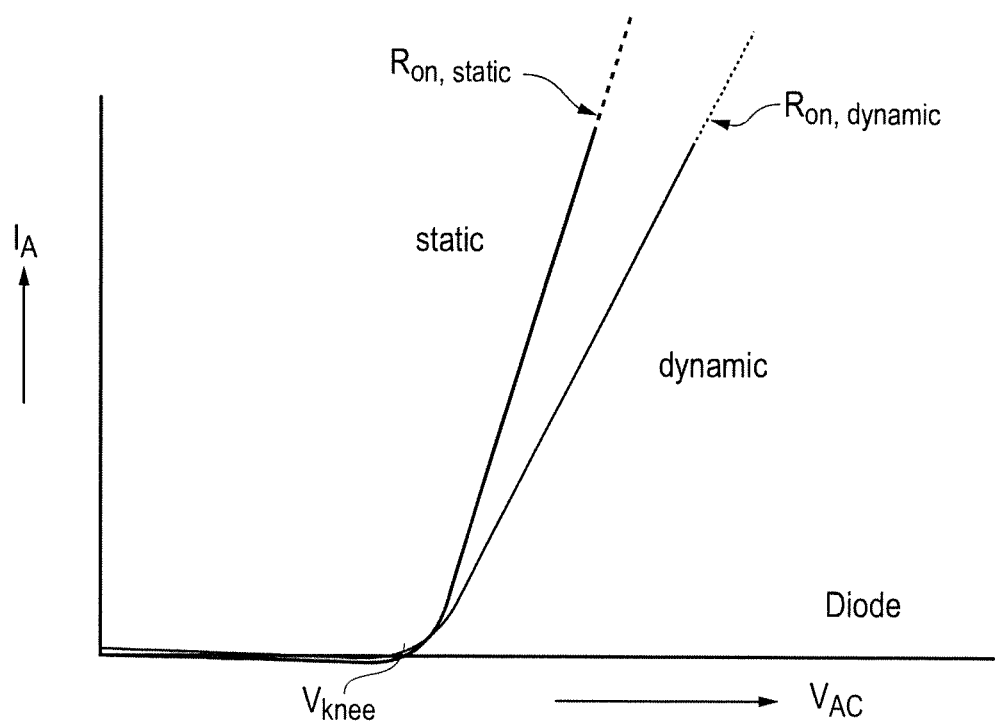
FIG. 1b is a graph showing how the voltage varies with current for a heterojunction Schottky diode in static and dynamic cases.

FIGS. 1a and 1b depict the situation where the on-state resistance under dynamic (e.g. switching, pulsed, RF) conditions is significantly higher than under DC conditions for a transistor and a Schottky diode respectively. In particular, FIG. 1a shows how the drain current of a HEMT varies with the voltage between the drain and the source terminals. FIG. 1b shows how the anode current of a Schottky diode varies with the voltage between the anode and the cathode. The higher the on-state resistance under dynamic conditions, the less suitable the device may be for switching or RF applications.

One reason for the high dynamic on-resistance shown in FIGS. 1a and 1b is electron trapping in either the passivation layers or in the first and second layer regions during high-voltage stress.

Figures 2A, 2B:
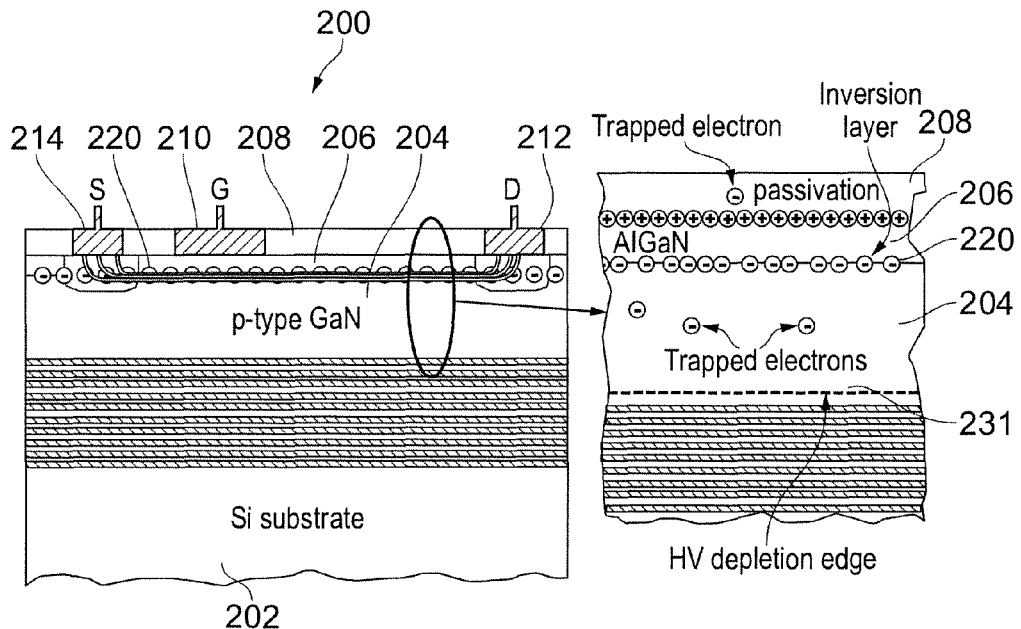
FIG. 2a is a cross-section of a HEMT heterojunction semiconductor device.
FIG. 2b is an enlarged portion of FIG. 2a showing how electrons may be trapped.
Figure 2C:
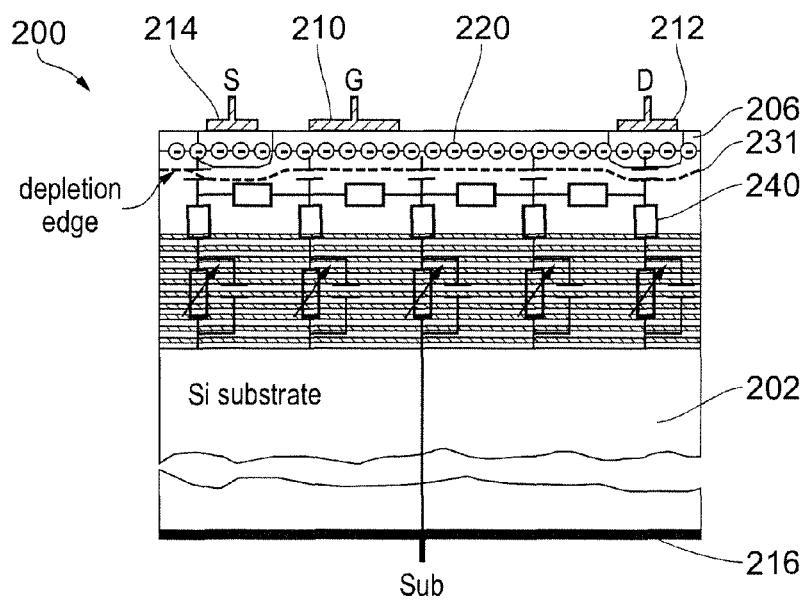
FIG. 2c shows how the device of FIG. 2a can be modelled by a number of interconnected resistors and capacitors.

FIG. 2a is a cross-section of a heterojunction semiconductor device. FIG. 2b is an enlarged portion of FIG. 2a showing how electrons form a 2DEG and how electrons may get trapped in a semiconductor layer. FIG. 2c depicts an equivalent circuit for the heterojunction semiconductor device of FIG. 2a.

As shown in FIG. 2a the heterojunction semiconductor device 200 comprises:
a substrate 202;
a multilayer structure disposed on the substrate, the multilayer structure comprising:
   a first layer 204 comprising a first semiconductor (in this case comprising GaN) disposed on top of the substrate 202;
   a second layer 206 comprising a second semiconductor (in this case comprising AlGaN) disposed on top of the first layer 204 to define an interface between the first layer and the second layer, wherein the second semiconductor is different from the first semiconductor such that a Two-Dimensional Electron Gas 220 forms adjacent to the interface;
a first terminal 210 (a gate terminal in this case) electrically coupled to a first area of the interface between the first layer and the second layer; and
a second terminal 212 (a drain terminal in this case) electrically coupled to a second area of the interface between the first layer and the second layer.

In this case, the heterojunction semiconductor device also comprises a third terminal 214 (a source terminal in this case) electrically coupled to a third area of the interface between the first layer and second layer.

In this example, the first layer 204 comprises a GaN buffer region that is doped with Carbon, which acts as an acceptor, i.e. electron trap.

FIG. 2a (and enlarged in FIG. 2b) depicts the situation when the junction is subjected to a high voltage stress (e.g. after having been turned off). When a high voltage stress is applied, a high voltage is applied to the second (drain) terminal which causes the depletion zone of the first layer to extend deeper into the first layer. The depletion zone edge 231 is shown in FIG. 2b for high drain voltage. This allows electron trapping to take place within the depletion region formed between the n-side of the junction (comprising the second terminal 212 and the Two-Dimensional Electron Gas (2DEG) connected to the second terminal) and the p-side of junction (in this case comprising p-type GaN). Because of the long time-constant the trapped electrons may remain there for a time after the device has been turned on and, because of charge-neutrality, these trapped electrons will locally reduce the 2DEG concentration. This results in a locally increased drift resistance shortly after switch on.

FIG. 2c shows the device of FIG. 2a modelled as an electrical circuit 240. The p-type GaN region is a floating, high-resistive region and its local potential depends on the resistive and capacitive coupling with the backside 216, gate 210 and source 214 contacts. These resistive and capacitive couplings are modelled as resistors and capacitors respectively.

During high-voltage stress the drain voltage is high, while the backside 216 (below the substrate 202) and source voltage stay at zero, and the gate voltage is negative. If the resistive path from a position in the first (GaN) layer to either backside 216, first (gate) terminal 210 or third (source) terminal 214 is lower than that to the second (drain) terminal 212, the local voltage there will stay low. This will result in a wide depletion layer between the n-side (second drain terminal and 2DEG) and the p-side (GaN buffer) being formed and more electron trapping will take place, which in turn will increase the dynamic on-resistance.

It will be appreciated that a Schottky diode (e.g. a GaN Schottky diode) can be simply thought of as a HEMT without a source contact. Therefore, the principles outlined above for a HEMT also apply to a Schottky diode.

Figure 2D:
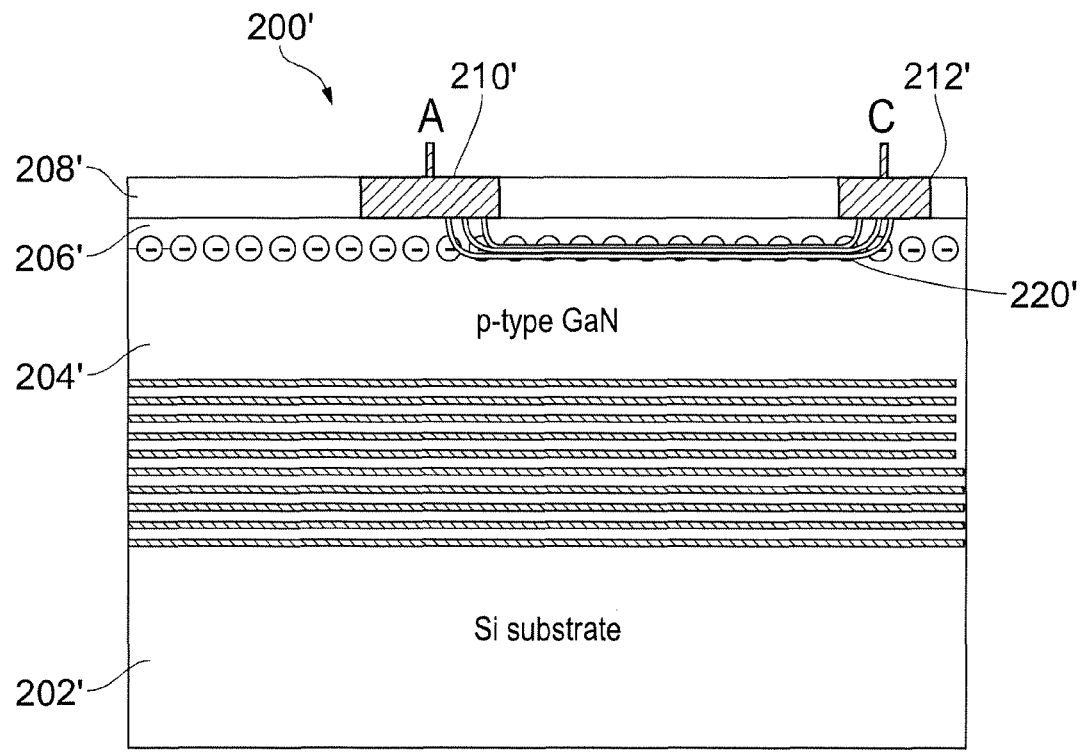
FIG. 2d is a cross-section of a Schottky diode heterojunction semiconductor device.

FIG. 2d is a cross-section of a Schottky diode 200'. As shown in FIG. 2d, the layer structure corresponds to that of FIG. 2a. In a Schottky diode the current flows between a first (anode) terminal 210' and a second (cathode) terminal 212' via a 2DEG 220'. As with the embodiment of FIG. 2a, when a high voltage is applied to the second terminal 212' the depletion zone of the first layer extends deeper into the first layer 204'. This allows electron trapping to take place within the depletion region formed between the n-side of the junction (comprising the second terminal 212' and the Two-Dimensional Electron Gas 220' (2DEG) connected to the second terminal) and the p-side of junction (in this case comprising p-type GaN). Because of the long time-constant the trapped electrons may remain there for a time after the device has been turned on and, because of charge-neutrality, these trapped electrons will locally reduce the 2DEG concentration. This results in a locally increased drift resistance shortly after switch on.

One or more of the examples that follow can prevent or reduce the formation of a wide depletion layer by locally introducing a conductive path between the two sides of the junction.

Figure 3A:
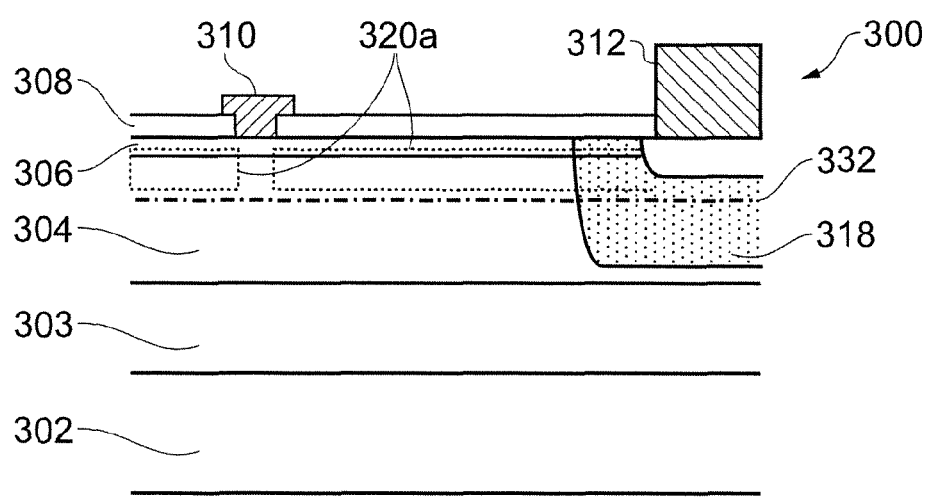
FIG. 3a is a cross-section of a further heterojunction semiconductor device when the drain voltage is low.
Figure 3B:
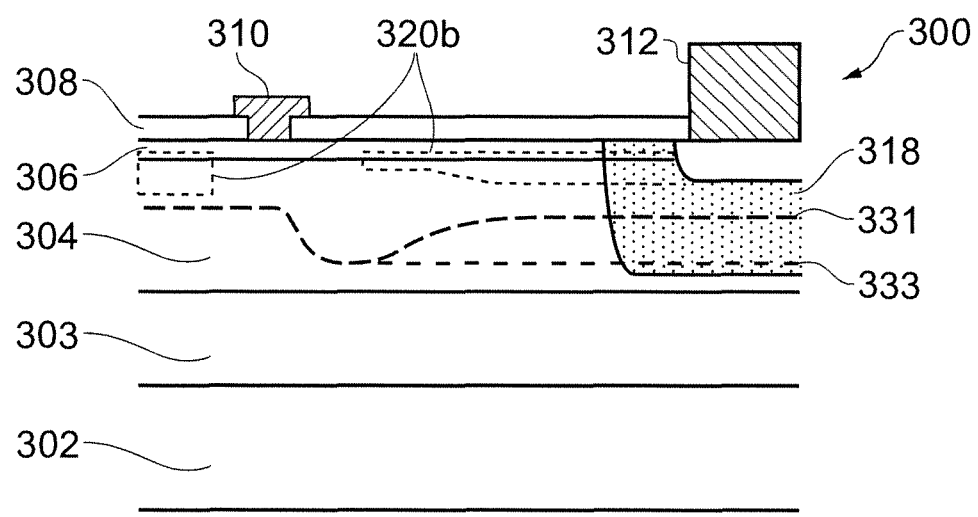
FIG. 3b is a cross-section of the device of FIG. 3a when the drain voltage is high.
Figure 3C:
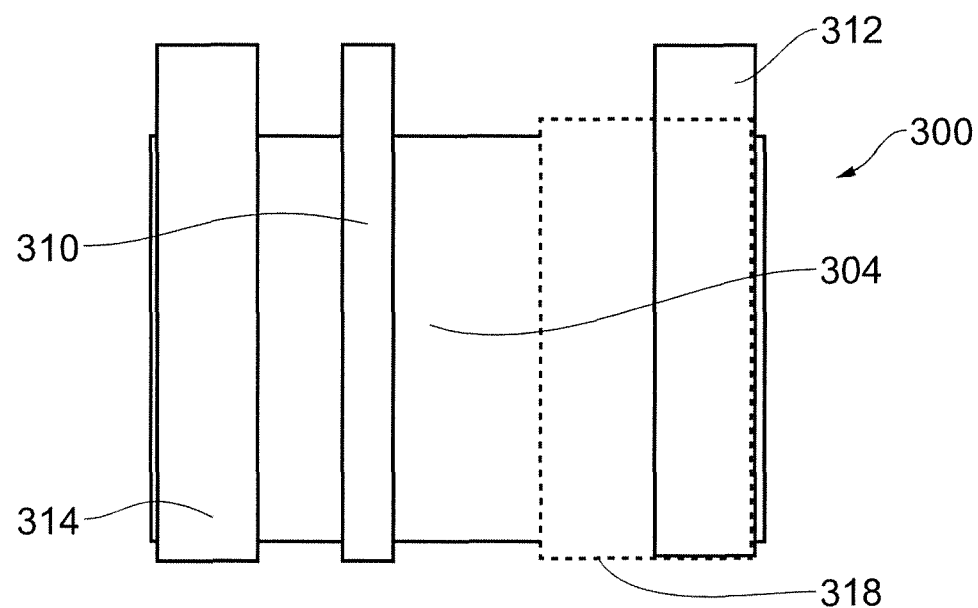
Figure 3D:
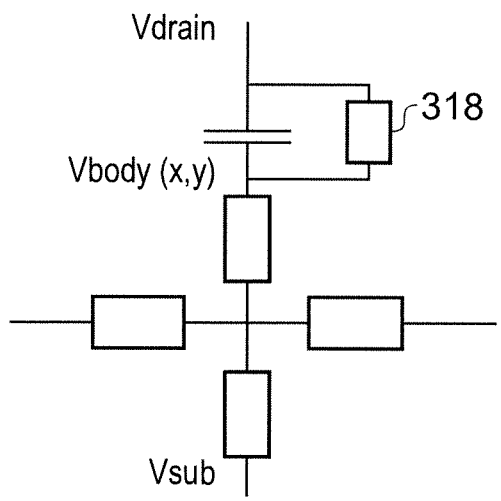
FIG. 3d shows how the device of FIGS. 3a and 3b can be modelled by a number of interconnected electronic components.

FIG. 3a depicts an embodiment of a heterojunction semiconductor device, which in this case is a high-electron-mobility transistor (HEMT), when there is no voltage applied to the first and second terminals. FIG. 3b depicts the heterojunction semiconductor device of FIG. 3a when there a high voltage applied to the second terminal. FIG. 3c is an overhead view of the device of FIG. 3a. FIG. 3d depicts an equivalent circuit for the heterojunction semiconductor device of FIG. 3a.

The heterojunction semiconductor device 300 comprises a substrate 302, a first semiconductor layer 304 disposed on top of the substrate 302 (with an optional stress relief layer 303 in between), a second semiconductor layer 306 disposed on top of the first semiconductor layer 304. Given an appropriate choice of materials for the first semiconductor layer 304 and the second semiconductor layer 306, a Two-Dimensional Electron Gas 320b (2DEG) will form near the interface between the first semiconductor layer 304 and the second semiconductor layer 306. The substrate 302 may comprise silicon, the first layer 304 may comprise a first semiconductor such as p-type GaN, the second layer 306 may comprise a second semiconductor such as AlGaN and a passivation layer 308 may comprise $SiO_2$ or SiN.

It will be appreciated by persons skilled in the art that optional additional layers may be present 303, such as a multilayer structure disposed between the substrate 302 and the first semiconductor layer 304 in order to accommodate any mismatch between the lattice constants of the substrate 302 and the first semiconductor layer 304.

The heterojunction semiconductor device 300, in this case, further comprises a first electrical terminal 310, which is a gate terminal, a second electrical terminal 312, which is a drain terminal; and a third electrical terminal which is a source terminal (not shown). The source terminal, the drain terminal 312, and the gate terminal 310, are electrically coupled to the second layer 306. This electrical coupling allows current to flow from the source terminal 314 to the drain terminal 312 through the 2DEG 320. Application of a blocking voltage to the gate terminal 310 disrupts the 2DEG 320 and thereby switches the HEMT 300 into an 'off', or non-conducting, state.

It will be appreciated by persons skilled in the art that, in such heterojunction semiconductor devices, the second terminal and the third terminal are electrically coupled to the heterojunction so as to allow electrical charge to flow into the heterojunction through the third (source) terminal and out of the heterojunction through the first (drain) terminal. The electrical coupling of the source terminal and the drain terminal to the heterojunction is typically achieved by an Ohmic contact.

As with the embodiment of FIG. 2a-2c, the formation of a deep depletion zone may trap electrons in the first layer thereby increasing the dynamic on-resistance. That is, trapped electrons may remain in the first semiconductor layer 304 for a relatively long period of time as they cannot recombine with holes because of the relatively low electrical conductivity of the first layer.

As described above, the presence of trapped electrons in the first semiconductor layer 304 may be undesirable because, being in close proximity to the 2DEG 320a and 320b, the trapped electrons reduce the density of electrons in the 2DEG 320a and 320b. This reduction in the density of the 2DEG 320a and 320b increases the resistance of the heterojunction semiconductor device 300, which consequently reduces the electrical performance of the heterojunction semiconductor device 300.

To prevent a deep depletion zone being established by a high drain voltage, and to enable the removal of the trapped electrons, this heterojunction semiconductor device of FIGS. 3a-3d, further comprises an electrically conducting channel 318 comprising a region of the first layer 304 with a higher defect density than another region of the first layer 304 (e.g. the area between the conducting channel and the first terminal), wherein the electrically conducting channel 318 connects the second terminal 312 and a region of the first layer 304 such that electric charge can flow between the second terminal 312 and the first layer 304. This conducting channel 318 electrically couples the first layer 304 to the second terminal 312 and so prevents locally the formation of a deep depletion zone, thereby reducing dynamic on-resistance.

In this case, the electrically conducting channel 318 has a higher defect density than the region of the first layer 304 around the first (gate) terminal. That is, the region of the first layer 304 directly underneath the second (drain) terminal and a contiguous area extending beyond the footprint of the second (drain) terminal (when viewed from above as in FIG. 3c) has a higher defect density than the rest of the first layer 304. In other words, the conducting channel 318 comprises the region directly below the footprint of the second terminal and an area around the footprint of the second terminal. In this way, the conducting channel extends partially towards the first (gate) terminal 310 from the second (drain) terminal. In this case the conducting channel 318 is provided by the introduction of defects in the crystal structure of the first (GaN) layer 304 by implanting non-dopant argon atoms in a dose of around 1e13 per $cm^2$. Other embodiments may use nitrogen. The implantation doses may be in the range of 1e11 to 1e12 per $cm^2$.

As shown in FIG. 3a, and as described above, the conducting channel 318 is located underneath the second (drain) terminal 312 and extends partially towards the first (gate) terminal 310. It will be appreciated that the effect of the conducting channel 318 should not extend to the gate region because that would lead to an increase in leakage current. The minimum distance between the conductive channel and the first (gate) terminal 310 is of the order of 2 times the thickness of the first layer 304.

FIG. 3a shows the situation when there is no bias between the first gate terminal and the second drain terminal. The position of the p-depletion edge 332 is relatively close to the heterojunction boundary between the first layer 304 and the second layer 306.

FIG. 3b shows the situation when a high drain voltage is applied to the second terminal 312. Line 333 shows where the p-depletion edge would be for a high drain voltage when applied to a device that does not include the conducting channel 318; and line 331 shows the line where the p-depletion edge is for a high drain voltage applied to a device that does include the conducting channel 318. That is, the inclusion of the conducting channel 318 reduces the depth of the depletion zone locally.

As shown in FIG. 3d, the effect of the conducting channel can be modelled as a resistor 318 connecting the first layer to the second (drain) terminal. If the resistance of resistor 318 is low relative to the effective resistance to the backside (through the substrate) or to the first or third terminals, the voltage of that body region, $V_{body}$, will follow the voltage of the drain terminal, $V_{drain}$. It will be appreciated, that the relative resistances to the voltage sources (the first, second and/or third terminals and the backside) will depend on the position within the body of the heterojunction device. Therefore, the voltage within the body region $V_{body}$ (x,y), will be position dependent.

It will be appreciated that a Schottky diode (e.g. a GaN Schottky diode) can be simply thought of as a HEMT without a source contact. Therefore, the principles outlined above for a HEMT also applies to a Schottky diode. In a Schottky diode the current flows between first (anode) terminal and second (cathode) terminal.

It will be appreciated that other defect density configurations may be used to provide an electrically conducting channel 318' which connects the second terminal 312' and a region of the first layer 304' such that electric charge can flow between the second terminal and the first layer.

Figure 3E:
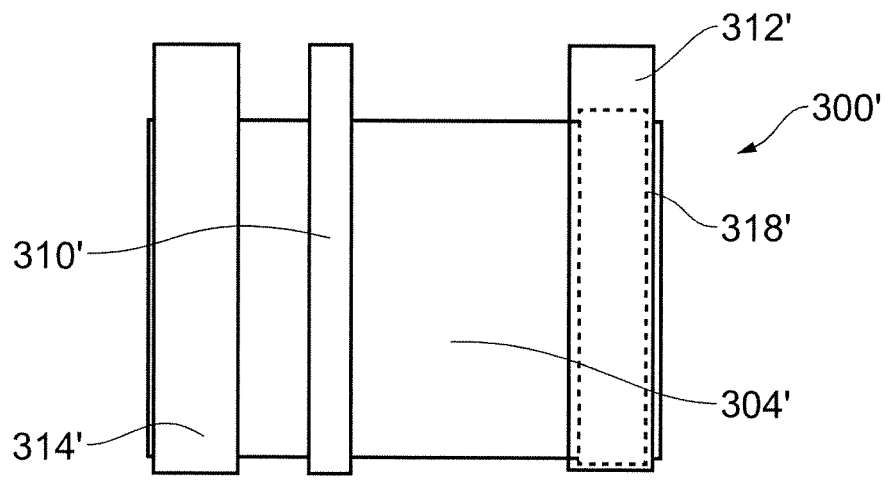
FIGS. 3e and 3f are overhead views of further heterojunction semiconductor devices where the conducting channel is provided with different defect density configurations.
Figure 3F:
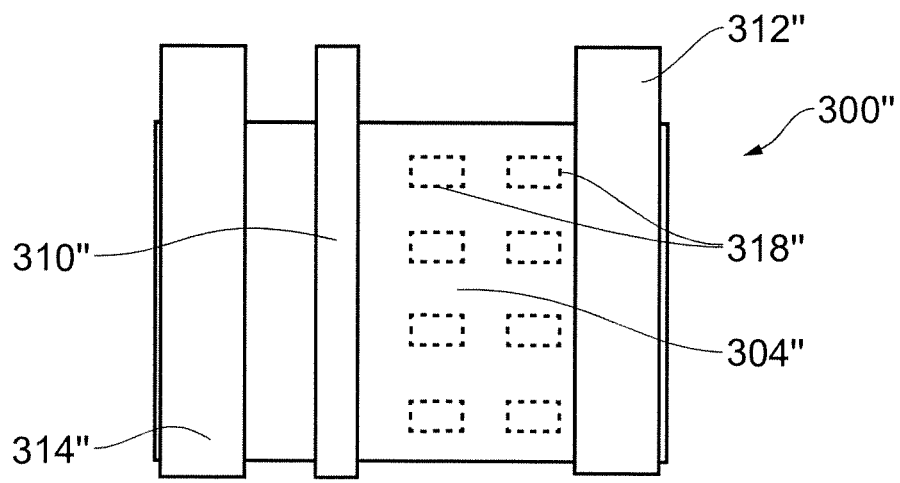

FIGS. 3e and 3f are overhead views of further heterojunction semiconductor devices 300', 300" where the conducting channel is provided with different defect density configurations. That is, the structure of each of the heterojunction semiconductor devices of FIGS. 3e and 3f is the same as that of FIG. 3a except that the area (or areas) of the first layer which has a higher defect density is different.

In the embodiment 300' of FIG. 3e, the region of the first layer 304' directly underneath the second (drain) terminal 312' (but not extending beyond the footprint of the second (drain) terminal 312' when viewed from above as in FIG. 3e) has a higher defect density than the rest of the first layer 304'. Unlike the embodiment of FIG. 3a, the conducting channel of the embodiment of FIG. 3e does not extend towards the first terminal from the second terminal. In other words, the conducting channel 318' comprises a region within and directly below the footprint of the second terminal 312'. In this way, the electrically conducting channel 318' connects the second terminal 312' and a region of the first layer 304' such that electric charge can flow between the second terminal and the first layer.

In the embodiment 300" of FIG. 3f, a plurality of separate regions of the first layer 304" have a higher defect density than the rest of the first layer 304", the separate regions forming the conducting channel 318". In this example, the plurality of regions making up the conducting channel 318" are located between the footprint of the second terminal 312" and the footprint of the first terminal 310", and are electrically connected to the second terminal 312" via the 2DEG. In this way, the electrically conducting channel 318" connects the second terminal 312" and a region of the first layer 304" such that electric charge can flow between the second terminal and the first layer. It will be appreciated that the implantation patterns may also extend below the footprint of the second terminal 312" in some embodiments. The number and area of these defect regions (or islands) may be configured (or optimised) such that they do not significantly increase the total resistance.

Figure 4A:
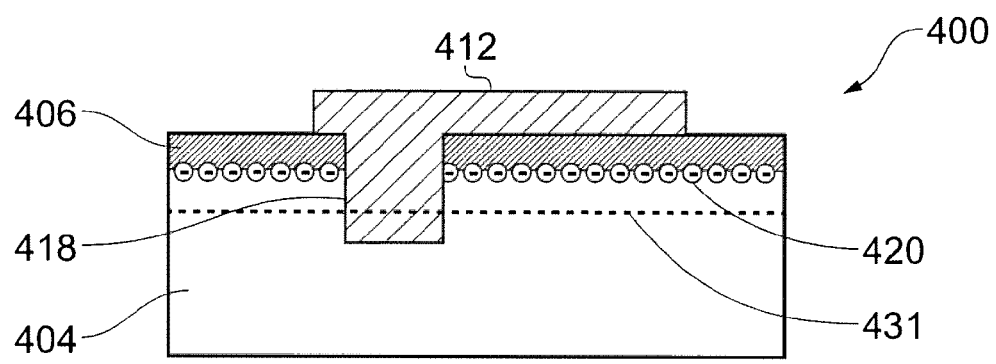
FIG. 4a is a first cross-section of a further heterojunction semiconductor device.
Figure 4B:
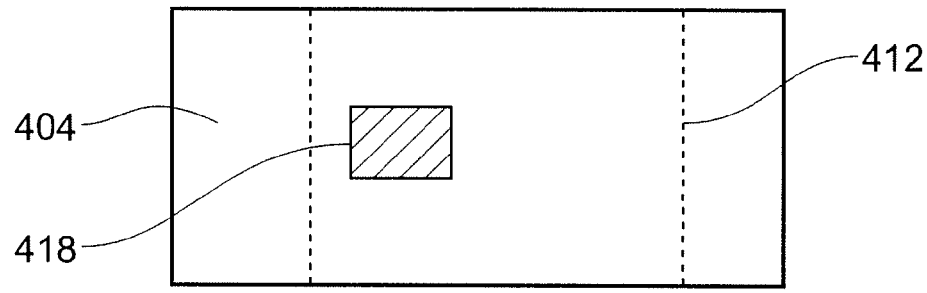

FIG. 4a and FIG. 4b are perpendicular cross-sections of an embodiment of a heterojunction semiconductor device 400.

In this case, the heterojunction semiconductor device comprises a substrate (not shown). A multilayer structure is disposed on the substrate, the multilayer structure comprising: a first layer 404 comprising a first semiconductor disposed, and a second layer 406 comprising a second semiconductor disposed on top of the first layer 404 to define an interface between the first layer 404 and the second layer 406. The second semiconductor is different from the first semiconductor such that a Two-Dimensional Electron Gas 420 forms adjacent to the interface. The heterojunction semiconductor device further comprises a first terminal electrically coupled to a first area of the interface between the first layer and second layer (not shown); and a second terminal 412 electrically coupled to a second area of the interface between the first layer and second layer. An electrically conducting channel 418 comprising a metal is also included. The electrically conducting channel connects the second terminal 412 and a region of the first layer 404 such that electric charge can flow between the second terminal 412 and the first layer 404 thereby electrically coupling the first layer 404 to the second terminal 412 and so preventing locally the formation of a deep depletion zone FIG. 4a is a cross-section through the second terminal 412 of the device and perpendicular to the plane of the device. FIG. 4b is a cross-section through the first layer 404 and is in the plane of the layer.

In this case, the conducting channel is provided by a locally recessed Ohmic contact 418 (e.g. comprising metal or other conductor in contact with the first layer 404). As shown in FIG. 4b, the conducting channel 418 is smaller than the second terminal in both dimensions in the plane of the device. That is, conducting channel 418 may be located below the second terminal within the footprint of the second terminal. That is, when viewed from above (as shown in FIG. 4b) the area of the conducting channel 418 is within the area of the second terminal 412.

The metal conducting channel 408, in this case, is provided by first etching through to the first layer 404 to form a recess (e.g. after dry etching the contact holes through any passivation layers, typically with a fluorine dry etch chemistry). Then the ohmic metal 418 is then deposited, contacting both the 2DEG 420 (as in conventional heterojunction devices) and the first layer 404 (e.g. comprising p-type GaN). For GaN/AlGaN embodiments, the recess may be formed using a $BCl_3$/$Cl_2$-based dry etch chemistry.

The recess depth may be below the 2DEG surface and above surface of the substrate. A typical channel depth may be equal to thickness of the first layer 404. It will be appreciated that the metal used in the recess may be a different metal than the metal used to interact with the 2DEG. The metal used in the conducting channel may comprise nickel.

The extent and position of the conductive channel may be configured to provide sufficiently conducting paths between regions of the first layer 404 and the second terminal 412 without significantly increasing the static on-resistance. The lateral dimensions of the unaffected portion of terminal 412 (i.e. the portion not directly connected to the conducting channel portion) must be larger than the transfer length (the characteristic length scale over which current is transferred between the metal and the semiconductor and is typically around 1 μm). The transfer length may depend on the contact resistance and the sheet resistance of the material under the terminal contact.

Figure 4C:
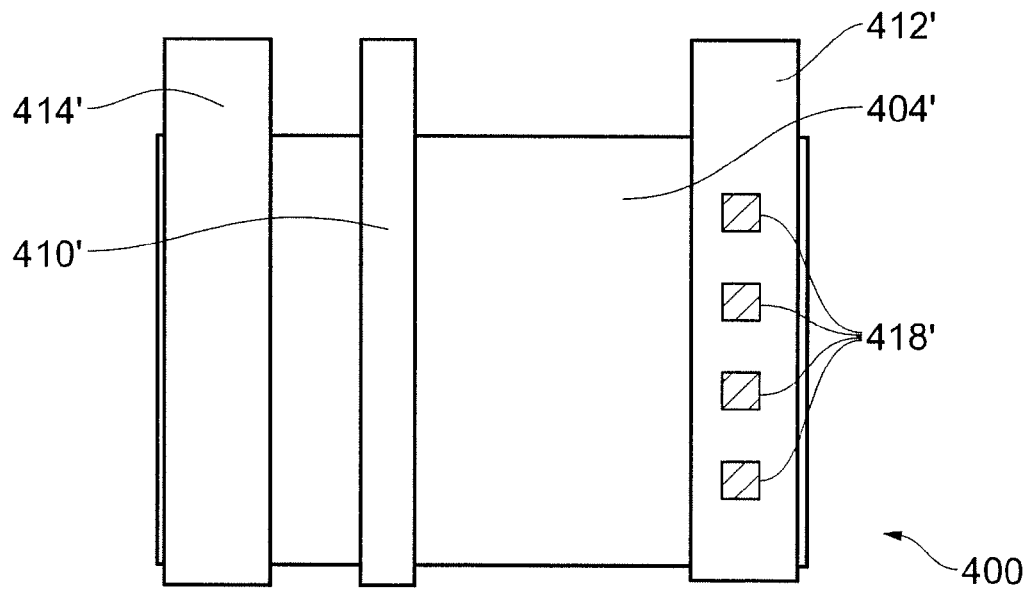
FIG. 4c is a perpendicular cross-section a device with a plurality of metallic conducting channels.

It will be appreciated that a particular embodiment may comprise a plurality of metallic conducting channels. FIG. 4c is an overhead view of a further embodiment 400' comprising a number of conducting channels 418" which extend from the second (drain) terminal 412" into the first layer 404". It will be appreciated that the number, area and position of the conducting channels 418" in the drain region may be configured (or optimised) such that they do not significantly increase the total resistance.

Due to recent advances in GaN-on-Si epitaxy, type III-V semiconductor devices, such as the HEMT 300 of FIG. 3, can be produced in low-cost high-volume mainstream Si production facilities. It is expected that GaN devices incorporating a conducting channel layer will prove successful across a broad range of applications, including in integrated circuits and in power-handling, radio-frequency and sensor applications.

Examples disclosed herein can relate to any power device where electron trapping affects the on-state resistance. This includes devices where a 2DEG defines the drift resistance. Such devices that include a 2DEG may include a heterojunction.

The invention claimed is:

1. A heterojunction semiconductor device comprising:
   a substrate;
   a multilayer structure disposed on the substrate, the multilayer structure comprising:
      a first layer comprising a first semiconductor disposed on top of the substrate;
      a second layer comprising a second semiconductor disposed on top of the first layer to define an interface between the first layer and the second layer, wherein the second semiconductor is different from the first semiconductor such that a Two-Dimensional Electron Gas (2DEG) forms adjacent to the interface;
   a first terminal electrically coupled to a first area of the interface between the first layer and second layer;
   a second terminal electrically coupled to a second area of the interface between the first layer and second layer, and
   an electrically conducting channel comprising at least one metallic conducting channel in contact with the first layer, wherein the electrically conducting channel connects the second terminal and a region of the first layer such that electric charge can flow between the second terminal and the first layer.

2. The heterojunction semiconductor device of claim 1, wherein the electrically conducting channel has a different conductivity than the second terminal.

3. The heterojunction semiconductor device of claim 1, wherein the conducting channel is located below the second terminal within an area of the second terminal.

4. The heterojunction semiconductor device of claim 1, wherein the conducting channel is located below the second terminal and extends partially towards the first terminal.

5. The heterojunction semiconductor device of claim 1, wherein the heterojunction semiconductor device comprises a passivation layer comprising a semiconductor passivation layer disposed on top of the second layer.

6. The heterojunction semiconductor device of claim 1, wherein the first semiconductor is a first III-V semiconductor, and the second semiconductor is a second III-V semiconductor.

7. The heterojunction semiconductor device of claim 1, wherein the first layer comprises Gallium Nitride.

8. The heterojunction semiconductor device of claim 1, wherein the second layer comprises Aluminium Gallium Nitride.

9. The heterojunction semiconductor device of claim 1, wherein the electrical coupling of the first terminal to the heterojunction semiconductor device comprises a Schottky contact with the second layer and the electrical coupling of the second terminal to the heterojunction semiconductor device comprises an Ohmic contact with the second layer, such that the heterojunction semiconductor device is configured to comprise a Schottky diode.

10. The heterojunction semiconductor device of claim 1, further comprising a third terminal electrically coupled to a third area of the heterojunction semiconductor device such that the first terminal is positioned between the second terminal and the third terminal.

11. The heterojunction semiconductor device of claim 10, wherein: the third terminal comprises a source terminal; the second terminal comprises a drain terminal; the first terminal comprises a gate terminal; whereby the heterojunction semiconductor device is configured to comprise a High Electron Mobility Transistor.

12. The heterojunction semiconductor device of claim 10, further comprising
a dielectric layer disposed between the second layer and the semiconductor passivation layer, wherein: the third terminal comprises a source terminal electrically coupled to the second layer such that electric charge can flow from the third terminal to the second layer; the second terminal comprises a drain terminal electrically coupled the second layer such that electric charge can flow from the second layer into the second terminal; the first terminal comprises a gate terminal disposed on top of the dielectric layer; whereby the heterojunction semiconductor device is configured to comprise a Metal-Insulator-Semiconductor High Electron Mobility Transistor.

13. The heterojunction semiconductor device of claim 1, wherein the heterojunction semiconductor device is implemented upon an integrated circuit.

14. The heterojunction semiconductor device of claim 1, wherein the at least one metallic conducting channel is located below the second terminal within a footprint of the second terminal.

15. The heterojunction semiconductor device of claim 1, wherein a metal in the at least one metallic conducting channel differs from a metal used to interact with the 2DEG.

16. The heterojunction semiconductor device of claim 1, wherein a metal in the at least one metallic conducting channel comprises nickel.

17. The heterojunction semiconductor device of claim 1, further comprising:
a plurality of metallic conducting channels.

* * * * *